(12) United States Patent
Ryan

(10) Patent No.: US 8,946,082 B2
(45) Date of Patent: Feb. 3, 2015

(54) METHODS FOR FORMING SEMICONDUCTOR DEVICES

(75) Inventor: Errol T. Ryan, Clifton Park, NY (US)

(73) Assignee: Globalfoundries, Inc., Grand Cayman (KY)

( * ) Notice: Subject to any disclaimer, the term of this patent is extended or adjusted under 35 U.S.C. 154(b) by 636 days.

(21) Appl. No.: 13/235,194

(22) Filed: Sep. 16, 2011

(65) Prior Publication Data

US 2013/0072019 A1    Mar. 21, 2013

(51) Int. Cl.
*H01L 21/44* (2006.01)
*H01L 21/768* (2006.01)

(52) U.S. Cl.
CPC .... *H01L 21/76843* (2013.01); *H01L 21/76856* (2013.01); *H01L 21/76865* (2013.01)
USPC ........................................................ 438/656

(58) Field of Classification Search
USPC ................................................ 438/627, 656
See application file for complete search history.

(56) References Cited

U.S. PATENT DOCUMENTS

2004/0265780 A1* 12/2004 Robb et al. ..................... 433/173
2009/0211667 A1* 8/2009 Suzuki et al. .................. 148/281
2009/0239372 A1* 9/2009 Cohen .......................... 438/618

OTHER PUBLICATIONS

U.S. Appl. No. 13/072,502, filed Mar. 25, 2011.

* cited by examiner

*Primary Examiner* — Bradley K Smith
(74) *Attorney, Agent, or Firm* — Ingrassia Fisher & Lorenz, P.C.

(57) ABSTRACT

Embodiments of methods for forming a semiconductor device are provided. The method includes forming a metal layer overlying a dielectric material. A thickness of the metal layer is reduced including oxidizing an exposed outer portion of the metal layer to form a metal oxide portion overlying a remaining portion of the metal layer and removing the metal oxide portion.

20 Claims, 3 Drawing Sheets

METHODS FOR FORMING SEMICONDUCTOR DEVICES

FIELD OF THE INVENTION

The present invention relates generally to semiconductor devices, and more particularly relates to methods for forming semiconductor devices including forming a very thin metal layer.

BACKGROUND OF THE INVENTION

Integrated circuits (ICs) typically include a plurality of semiconductor devices including interconnect wiring. Networks of metal interconnect wiring are often used to connect the semiconductor devices from the semiconductor portion of the substrate. Multiple levels of metal interconnect wiring above the semiconductor portion of the substrate are connected together to form a back-end-of-the-line ("BEOL") interconnect structure. Within such a structure, metal lines run parallel to the substrate and conductive vias run perpendicular to the substrate. The conductive vias typically interconnect the different levels of the metal wiring levels.

High performance of contemporary ICs may be achieved using a highly conductive metal, such as copper, as the interconnect metal of the BEOL interconnect structure, which also employs a low dielectric constant material or dielectric material as an interlevel dielectric (ILD) layer or layers. The dielectric material may be non-porous, porous or a combination of porous and non-porous. To help hold the highly conductive interconnect metal to the dielectric material, a metal liner material, such as tantalum or tantalum nitride, is deposited onto the dielectric material to form a metal liner layer. Then, a conductive metal seed layer, such as a layer of copper or copper alloy, is formed on the metal liner layer and the highly conductive metal is deposited over the conductive metal seed layer to form a metal interconnect wire.

Unfortunately, the metal liner material has a relatively high resistivity compared to the highly conductive metal and thus, can effectively decrease the overall conductivity of the metal interconnect wire. Additionally, because the feature sizes of many elements on semiconductor devices are steadily decreasing with the introduction of newer semiconductor technologies, it is desirable to reduce or minimize the thickness of the metal liner layer to increase the cross-sectional area of the highly conductive metal to preferably maximize the conductivity of the metal interconnect wire without adversely affecting any packaging space requirements. However, controllably forming a very thin metal layer for a semiconductor device using current approaches can be challenging because even at low rates of depositing the metal material onto the dielectric material, small variations in the deposition time can result in relatively large differences in the thickness of the metal layer. Moreover, controllably forming a very thin metal layer to continuously cover a dielectric material that has a relatively rough surface, e.g., a surface of a porous dielectric material, using current approaches further exacerbates this challenge.

Accordingly, it is desirable to provide methods for forming a semiconductor device including controllably forming a very thin metal layer that may function, for example, as a metal liner layer or other semiconductor metal layer structure. Moreover, it is desirable to provide methods for forming a semiconductor device including controllably forming a very thin metal layer to continuously cover a dielectric material that has a relatively rough surface. Furthermore, other desirable features and characteristics of the present invention will become apparent from the subsequent detailed description and the appended claims, taken in conjunction with the accompanying drawings and the foregoing technical field and background of the invention.

SUMMARY OF THE INVENTION

Methods for forming the semiconductor devices are provided herein. In accordance with an exemplary embodiment, a method for forming a semiconductor device includes forming a metal layer overlying a dielectric material. A thickness of the metal layer is reduced including oxidizing an exposed outer portion of the metal layer to form a metal oxide portion overlying a remaining portion of the metal layer, and removing the metal oxide portion.

In accordance with another exemplary embodiment, a method for forming a semiconductor device is provided. The method includes depositing a metal material over a dielectric material to form a metal layer. An exposed outer portion of the metal layer is oxidized to form a metal oxide portion overlying a remaining portion of the metal layer. The metal oxide portion is selectively etched leaving the remaining portion of the metal layer overlying the dielectric material to define an ultrathin metal layer.

In accordance with another exemplary embodiment, a method for forming a semiconductor device is provided. The method includes forming a trench in a dielectric material. A metal layer is deposited in the trench overlying the dielectric material. A thickness of the metal layer is reduced including oxidizing an exposed outer portion of the metal layer to form a metal oxide portion overlying a remaining portion of the metal layer.

The metal oxide portion is removed to form a liner in the trench defined by the remaining portion of the metal layer. A metal seed forming material is deposited onto the liner to form a metal seed layer overlying the liner. A conductive metal material is deposited onto the metal seed layer to at least partially fill the trench.

BRIEF DESCRIPTION OF THE DRAWINGS

Embodiments of the present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any theory presented in the preceding Background of the Invention or the following Detailed Description.

Various embodiments contemplated herein relate to methods for forming a semiconductor device. During intermediate stages of the fabrication of a semiconductor device, a metal material is deposited over a dielectric material to form a metal layer that is thicker than its intended finished form. The thickness of the metal layer is then reduced by oxidizing an exposed outer portion of the metal layer to form a metal oxide portion that is subsequently removed, leaving a thinner, remaining portion of the metal layer overlying the dielectric material. In an exemplary embodiment, the thinner, remaining portion of the metal layer defines an ultrathin metal layer preferably having a thickness of less than about 3 nm. The inventor has found that an ultrathin metal layer can be controllably formed to a desired thickness by forming a relatively thicker metal layer overlying a dielectric material, e.g., using conventional deposition approaches, then controllably oxidizing an exposed outer portion of the metal layer, e.g., using ambient or thermal oxidation, and removing the oxidized portion, e.g., using a selective wet etch process. Moreover, forming the ultrathin metal layer in accordance with various embodiments contemplated herein preferably continuously covers the dielectric material even if the dielectric material has a relatively high surface roughness, such as, for example, in the case of a porous dielectric material.

Figure 1:
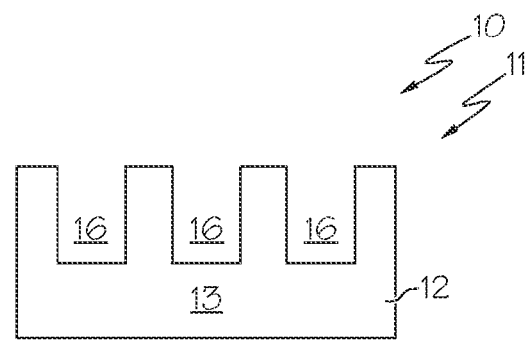
FIG. 1-8 schematically illustrate, in cross-sectional views, a semiconductor device during stages of its fabrication in accordance with exemplary embodiments.

FIGS. 1-8 illustrate schematically, in cross-sectional view, a semiconductor device 10 and process steps for fabricating the semiconductor device 10 in intermediate fabrication stages. As illustrated in FIG. 1, the semiconductor device 10 is configured as an interconnect structure 11 and includes an interlevel dielectric substrate or interlevel dielectric (ILD) 12 with trenches 16 formed in the ILD 12. Although the semiconductor device 10 is shown configured as an interconnect structure 11, it will be appreciated that the semiconductor device may be any other semiconductor structure that includes a dielectric material. In a more advanced fabrication stage and as discussed in further detail below, highly conductive metal lines 14 (e.g. copper lines) are formed in the trenches 16 (see FIG. 5).

In its completed form, the interconnect structure 11 is typically located on a semiconductor substrate (not shown) or is one of several interconnect structures that are stacked together to implement the circuit function being implemented on the semiconductor substrate. The semiconductor substrate contains, for example, various electronic devices including a plurality of interconnected field effect transistors (FETs), also called metal oxide semiconductor field effect transistors (MOSFETs), or simply MOS transistors, in the form of NMOS (N-channel FET) and/or PMOS elements (P-channel FET). The highly conductive metal lines 14 in the ILD 12 run parallel to the ILD 12 (see FIG. 5) and conductive vias (not shown) run perpendicular to the ILD 12 to interconnect the different levels of the highly competitive metal lines 14 in the BEOL with the various electronic devices on the semiconductor substrate.

Referring to FIG. 1, the ILD 12 is formed from a dielectric material 13 that preferably has a dielectric constant of about 4 or less, more preferably of about 3.5 or less. The various dielectric materials that may be used to form the ILD 12 include inorganic dielectrics or organic dielectrics that are porous, nonporous or contain regions and/or surfaces that are porous and other regions and/or surfaces that are nonporous. Some non-limiting examples of ILD dielectric materials are silsesquioxanes, organosilicates that include atoms of Si, C, O, and H, polymeric materials such as thermosetting polyarylene ethers, or multilayers thereof. The thickness of the ILD 12 may vary depending upon the dielectric material used and its intended use in the integrated circuit being implemented. Typically, the ILD 12 has a thickness from about 50 to about 1000 nm.

The ILD 12 is formed by, for example, a deposition process including plasma enhanced chemical vapor deposition (PECVD), chemical vapor deposition (CVD), evaporation, and chemical solution deposition. After forming the ILD 12, lithography and etching are used to form the trenches 16 and other openings (e.g. for vias) as is well known in the art.

Figure 2:
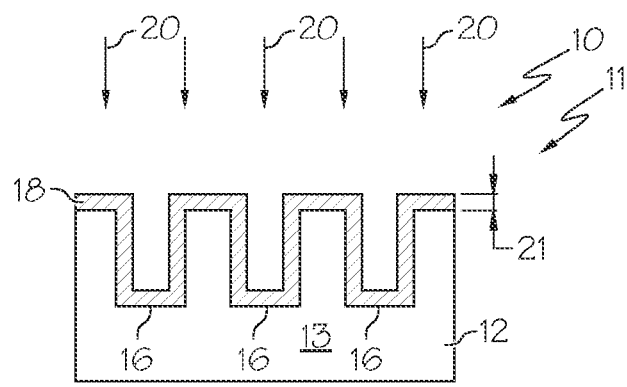

In an exemplary embodiment and referring to FIG. 2, a metal material is deposited over the ILD 12 and into the trenches 16 using a deposition process as indicated by arrows 20 to form a metal layer 18 having an original thickness as indicated by double headed arrows 21. Preferably, the original thickness 21 is about 3 nm or greater to facilitate formation of the metal layer 18 using a conventional deposition process. The metal material may be a metal liner forming material, such as, for example, tantalum, tantalum nitride, titanium, titanium nitride, ruthenium, and/or ruthenium nitride. Alternatively, the metal material may be any other metal material known to those skilled in the art for forming a metal layer that may be subsequently oxidized via an oxidation process as discussed in further detail below. The deposition process 20 is preferably a physical vapor deposition process, but other deposition processes or metal layer forming processes known to those skilled in the art may also be used.

Figure 3:
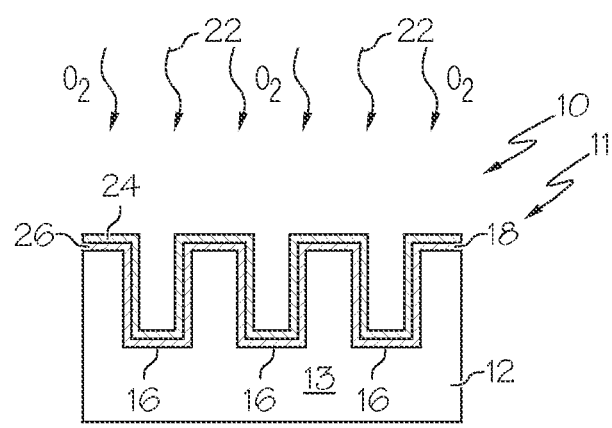

Referring to FIG. 3, an upper exposed portion of the metal layer 18 is oxidized by oxygen using an oxidation process as indicated by arrows 22 to form a metal oxide portion 24 overlying a remaining portion 26 of the metal layer 18. The oxidation process 22 can be an ambient oxidation process in which the upper exposed portion of the metal layer 18 is exposed to ambient air for a period of time or alternatively, can be a thermal oxidation process in which the upper exposed portion of the metal layer is exposed to an oxidizing atmosphere at an elevated temperature for a period of time. The metal oxide portion 24 may be formed to a desired thickness by controlling the parameters of the oxidation process 22, such as, for example, the period of exposure time, the concentration of oxygen in the oxygen-containing atmosphere, and the temperature of the oxygen-containing atmosphere. In an exemplary embodiment, the metal oxide portion 24 has a thickness that is at least about 50% of the original thickness 21 (see FIG. 2).

Figure 4:
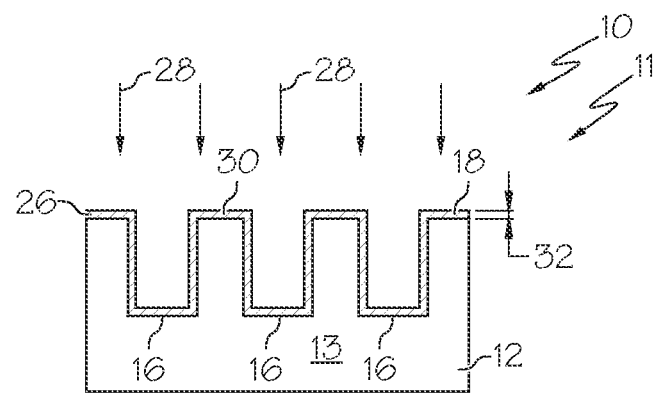

Referring to FIG. 4, the metal oxide portion 24 is removed leaving the remaining portion 26 of the metal layer 18 overlying the dielectric material 13. In an exemplary embodiment, the remaining portion 26 of the metal layer 18 defines an ultrathin metal layer 30. In one embodiment, the ultrathin metal layer 30 has a thickness 32 that is about 50% or less of the original thickness 21 (see FIG. 2) of the metal layer 18. Preferably, the thickness 32 of the ultrathin metal layer 30 is less than about 3 nm, more preferably about 2 nm or less, and most preferably about 1 nm or less.

In an exemplary embodiment, the metal oxide portion 24 is removed using a selective etching process 28 that preferentially removes the metal oxide portion 24 while leaving the remaining portion 26 of the metal layer 18 substantially intact. The selective etching process 28 may use a wet etchant that is preferably a dilute acidic solution and includes, for example, citric acid, hydrochloric acid, sulfuric acid, nitric acid, hydrochloric acid, and/or phosphoric acid. Alternatively, the selective etching process 28 may be a dry etching process using, for example, a plasma removal process. Other processes known to those skilled in the art for selectively removing a metal oxide layer while leaving an underlying base metal layer substantially intact may be used. The etchant used will depend, in part, on the metal material deposited, and hence on the oxide formed. The etchant selected should etch the oxide at a much greater rate than the etch rate of the underlying metal.

Figure 5:
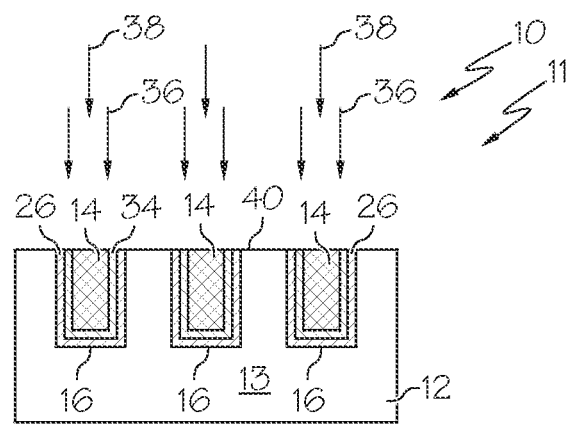

Referring to FIG. 5, a thin seed layer 34 (e.g. thin copper or copper alloy seed layer) is deposited using a well-known deposition process as indicated by arrows 36 into the trenches 16. A highly conductive metal, such as copper, is subsequently deposited (e.g. via electroplating as indicated by arrows 38) into the trenches 16 to form highly conductive metal lines 14 (e.g. copper lines) that at least partially fill the trenches 16. An upper surface 40 of the ILD 12 and the highly conductive metal lines 14 are preferably made coplanar by being polished and cleaned by, for example, a chemical mechanical planarization (CMP) process. Although not illustrated, the semiconductor device 10 is then completed by employing well-known processing steps such as depositing an encapsulating dielectric layer, etching openings through the dielectric layer, forming bonding pads, contacting the underlying interconnect structure, and the like.

Figure 6:
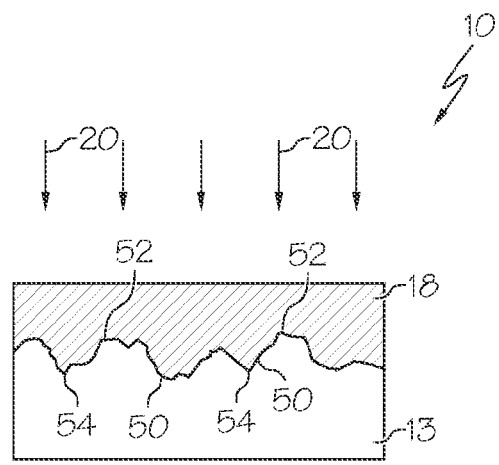

Referring to FIG. 6, an alternative embodiment for forming a semiconductor device 10 is provided. As illustrated, the semiconductor device 10 is configured generally as a semiconductor structure that includes a dielectric material 13. The dielectric material 13 has a surface roughness 50 that includes peaks 52 and valleys 54 (e.g. a surface of a porous dielectric material). A metal material is deposited over the dielectric material 13 using a deposition process as indicated by arrows 20 (as discussed above) to form a metal layer 18 that continuously covers the surface roughness 50. The metal material tends to fill in and smooth out the surface roughness 50 formed by the peaks 52 and valleys 54 during the deposition process.

Figure 7:
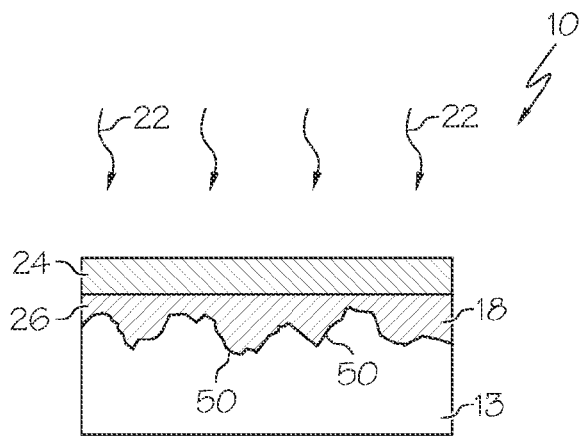
Figure 8:
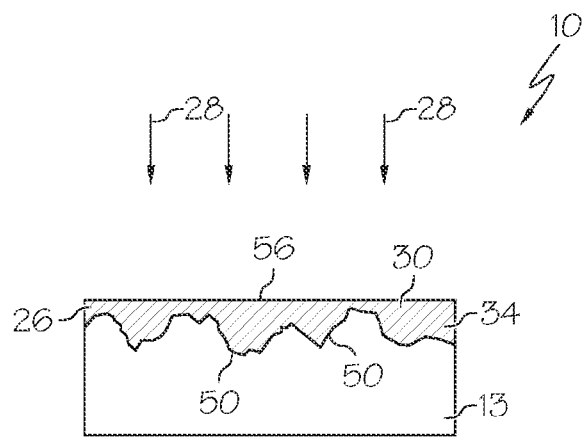

Referring to FIG. 7, an upper exposed portion of the metal layer 18 is oxidized using an oxidation process as indicated by arrows 22 (as discussed above) to form a metal oxide portion 24 overlying a remaining portion 26 of the metal layer 18. Referring to FIG. 8, the metal oxide portion 24 is removed using a selective etching process 28 (as discussed above) that preferentially removes the metal oxide portion 24 while leaving the remaining portion 26 of the metal layer 18 substantially intact to continuously cover the dielectric material 13. In an exemplary embodiment, the remaining portion 26 of the metal layer 18 defines an ultrathin metal layer 30 that has a surface roughness 56 that is less than the surface roughness 50 of the dielectric material 13.

Accordingly, methods for forming a semiconductor device have been described. In an exemplary embodiment, an ultrathin metal layer can be controllably formed to a desired thickness by forming a relatively thicker metal layer overlying a dielectric material, then controllably oxidizing an exposed outer portion of the metal layer and removing the oxidized portion. Moreover, forming the ultrathin metal layer in accordance with various embodiments contemplated herein preferably continuously covers the dielectric material even if the dielectric material has a relatively high surface roughness, such as, for example, in the case of a porous dielectric material.

While at least one exemplary embodiment has been presented in the foregoing Detailed Description, it should be appreciated that a vast number of variations exist. It should also be appreciated that the exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention, it being understood that various changes may be made in the function and arrangement of elements described in an exemplary embodiment without departing from the scope of the invention as set forth in the appended Claims and their legal equivalents.

What is claimed is:

1. A method for forming a semiconductor device, the method comprising:
    forming a metal layer overlying a dielectric material in an interconnect structure portion of an integrated circuit; and
    reducing a thickness of the metal layer including:
        oxidizing an exposed outer portion of the metal layer to form a metal oxide portion overlying a remaining portion of the metal layer; and
        removing the metal oxide portion in the interconnect structure portion of the integrated circuit.

2. The method according to claim 1, wherein forming the metal layer includes forming the metal layer comprising a metal material selected from the group consisting of tantalum, tantalum nitride, titanium, titanium nitride, ruthenium, ruthenium nitride, and combinations thereof.

3. The method according to claim 1, wherein forming the metal layer includes depositing a metal material over the dielectric material using physical vapor deposition.

4. The method according to claim 1, wherein oxidizing the exposed outer portion of the metal layer includes forming the metal oxide portion using thermal oxidation.

5. The method according to claim 1, wherein oxidizing the exposed outer portion of the metal layer includes forming the metal oxide portion using ambient oxidation.

6. The method according to claim 1, wherein removing the metal oxide portion includes selectively etching the metal oxide portion.

7. The method according to claim 6, wherein removing the metal oxide portion includes selectively wet etching the metal oxide portion with an etchant that comprises citric acid, hydrochloric acid, sulfuric acid, nitric acid, hydrochloric acid, phosphoric acid, or combinations thereof.

8. The method according to claim 1, wherein forming the metal layer includes forming the metal layer having an original thickness of about 3 nm or greater, and wherein reducing the thickness of the metal layer includes forming an ultrathin metal layer that has a reduced thickness of less than about 3 nm while being sufficiently thick so as to continuously cover the dielectric material, and wherein the ultrathin metal layer is defined by the remaining portion of the metal layer.

9. The method according to claim 8, wherein forming the ultrathin metal layer includes forming the ultrathin metal layer having the reduced thickness of about 1 nm or less while being sufficiently thick so as to continuously cover the dielectric material.

10. The method according to claim 1, wherein forming the metal layer includes forming the metal layer having an original thickness, and wherein reducing the thickness of the metal layer includes forming an ultrathin metal layer having a reduced thickness of about 50% or less of the original thickness, and wherein the ultrathin metal layer is defined by the remaining portion of the metal layer.

11. The method according to claim 1, wherein forming the metal layer includes forming the metal layer so as to continuously cover the dielectric material, and wherein the dielectric material has a dielectric material surface roughness and reducing the thickness of the metal layer includes forming an ultrathin metal layer having an outer metal layer surface roughness that is less than the dielectric material surface roughness.

12. A method for forming a semiconductor device, the method comprising:
    depositing a metal material over a dielectric material in an interconnect structure portion of an integrated circuit to form a metal layer;
    oxidizing an exposed outer portion of the metal layer to form a metal oxide portion overlying a remaining portion of the metal layer; and
    selectively etching the metal oxide portion and leaving the remaining portion of the metal layer overlying the dielectric material to define an ultrathin metal layer in the interconnect structure portion of the integrated circuit.

13. The method according to claim 12, wherein selectively etching the metal oxide portion includes defining the ultrathin metal layer having a reduced thickness of less than about 3 nm while being sufficiently thick so as to continuously cover the dielectric material.

14. The method according to claim 12, wherein depositing the metal material includes forming the metal layer having an original thickness, and wherein selectively etching the metal oxide portion includes defining the ultrathin metal layer having a reduced thickness of about 50% or less of the original thickness.

15. The method according to claim 12, further comprising forming a trench in the dielectric material, wherein depositing the metal material includes depositing the metal material into the trench, and wherein selectively etching the metal oxide portion includes forming a liner in the trench defined by the ultrathin metal layer.

16. The method according to claim 15, further comprising depositing a metal seed forming material onto the liner to form a metal seed layer overlying the liner.

17. The method according to claim 16, further comprising electroplating a conductive metal material onto the metal seed layer.

18. The method according to claim 12, wherein oxidizing the exposed outer portion of the metal layer includes forming the metal oxide portion using ambient oxidation or thermal oxidation, and wherein selectively etching the metal oxide portion includes selectively wet etching the metal oxide portion with an etchant that comprises an acid.

19. The method according to claim 12, wherein depositing the metal material includes forming the metal layer so as to continuously cover the dielectric material, and wherein the dielectric material has a dielectric material surface roughness and selectively etching the metal oxide portion includes defining the ultrathin metal layer having an outer metal layer surface roughness that is less than the dielectric material surface roughness.

20. A method for forming a semiconductor device, the method comprising:
   forming a trench in a dielectric material in an interconnect structure portion of an integrated circuit;
   depositing a metal layer in the trench overlying the dielectric material;
   reducing a thickness of the metal layer including:
      oxidizing an exposed outer portion of the metal layer to form a metal oxide portion overlying a remaining portion of the metal layer; and
      removing the metal oxide portion to form a liner in the trench defined by the remaining portion of the metal layer in the interconnect structure portion of the integrated circuit,
   depositing a metal seed forming material onto the liner to form a metal seed layer overlying the liner; and
   depositing a conductive metal material onto the metal seed layer to at least partially fill the trench.

* * * * *